US012713779B2

(12) United States Patent
Kang et al.

(10) Patent No.: US 12,713,779 B2
(45) Date of Patent: Aug. 18, 2026

(54) DISPLAY APPARATUS AND METHOD OF MANUFACTURING THE SAME

(71) Applicant: Samsung Display Co., Ltd., Yongin-si (KR)

(72) Inventors: Jangmi Kang, Yongin-si (KR); Myunghoon Park, Yongin-si (KR); Byungchang Yu, Yongin-si (KR); Donghoon Lee, Yongin-si (KR)

(73) Assignee: Samsung Display Co., LTD., Gyeonggi-do (KR)

( * ) Notice: Subject to any disclaimer, the term of this patent is extended or adjusted under 35 U.S.C. 154(b) by 396 days.

(21) Appl. No.: 18/488,093

(22) Filed: Oct. 17, 2023

(65) Prior Publication Data

US 2024/0130168 A1 Apr. 18, 2024

(30) Foreign Application Priority Data

Oct. 18, 2022 (KR) ........................ 10-2022-0134459

(51) Int. Cl.
*H10K 59/122* (2023.01)
*H10K 59/131* (2023.01)

(52) U.S. Cl.
CPC ......... *H10K 59/122* (2023.02); *H10K 59/131* (2023.02)

(58) Field of Classification Search
CPC .... H10K 59/122; H10K 59/131; H10K 59/00; H10K 59/129; H10K 59/124; H10K 50/81; H10K 50/822; H10K 50/844; H10H 20/857; H10W 90/00
See application file for complete search history.

(56) References Cited

U.S. PATENT DOCUMENTS 8,536,580 B2 9/2013 Kang
9,035,330 B2 5/2015 Kang et al.
9,941,338 B2 4/2018 Seo et al.
2022/0077252 A1* 3/2022 Choung .............. H10K 59/173
2023/0196986 A1 6/2023 Yu et al.

FOREIGN PATENT DOCUMENTS

CN 113629115 A 11/2021
KR 10-0811997 3/2008
KR 10-1146991 5/2012
KR 10-1811027 12/2017
KR 10-2331597 11/2021
KR 10-2023-0096204 6/2023

* cited by examiner

*Primary Examiner* — Anne M Hines
*Assistant Examiner* — Jose M Diaz
(74) *Attorney, Agent, or Firm* — Harness, Dickey & Pierce, P.L.C.

(57) ABSTRACT

A display apparatus includes a display area in which a plurality of light-emitting diodes are disposed, a common voltage supply line disposed in a non-display area outside the display area, an organic insulating layer disposed on the common voltage supply line, a connection electrode layer disposed on the organic insulating layer and electrically connected to the common voltage supply line, an insulating layer disposed on the connection electrode layer, and a metal bank layer electrically connected to the connection electrode layer through a contact hole of the insulating layer, wherein the metal bank layer includes a first hole overlapping the organic insulating layer, and each of the connection electrode layer and the insulating layer includes a hole overlapping the first hole of the metal bank layer.

20 Claims, 9 Drawing Sheets

FIG. 7

III
DA
NDA
300
W2
300h2
35E1
35
W1
35h,300h1
300E
PW1
10
35E2
y
x

FIG. 8

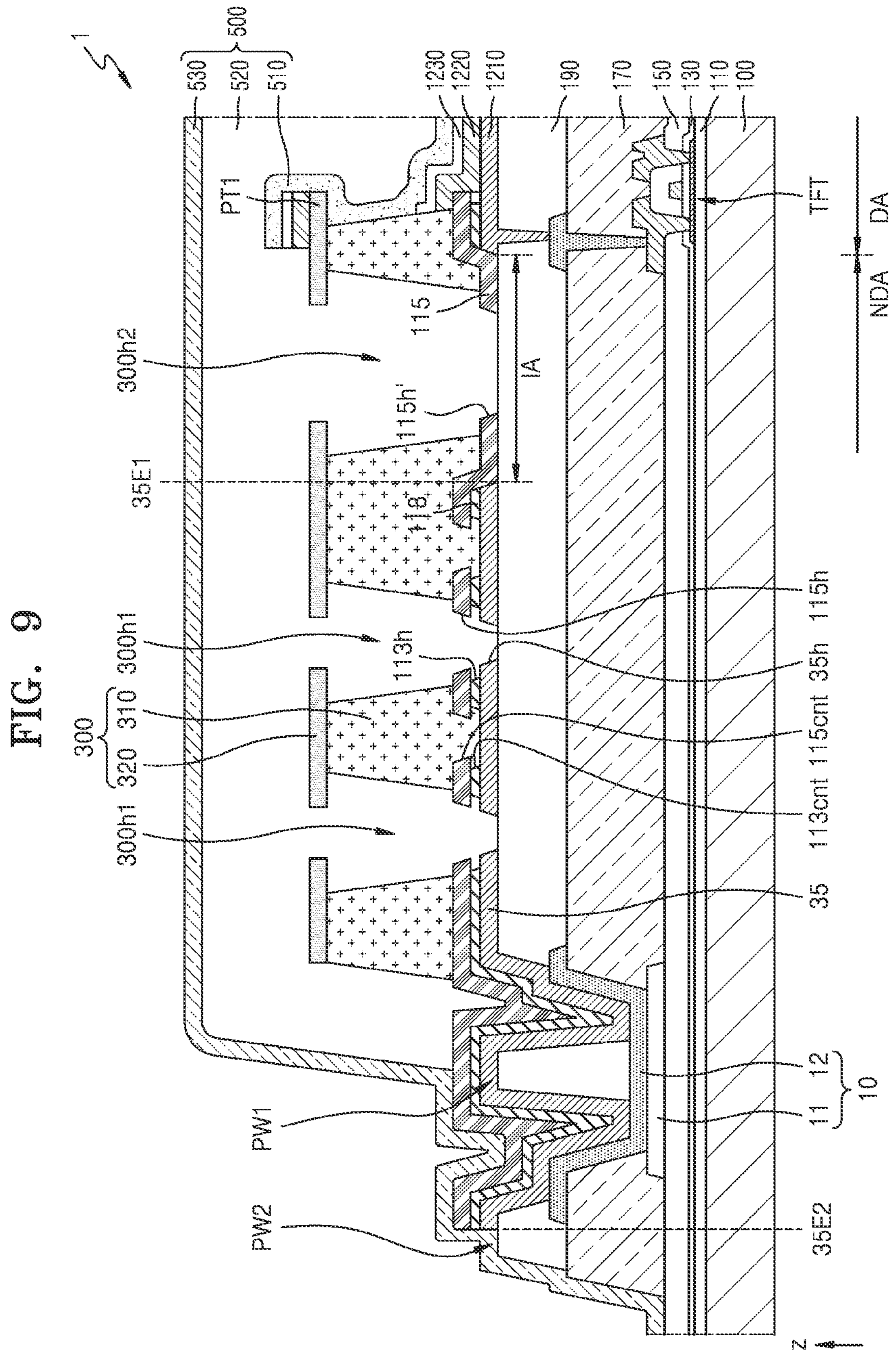

DISPLAY APPARATUS AND METHOD OF MANUFACTURING THE SAME

CROSS-REFERENCE TO RELATED APPLICATION(S)

This application claims priority to and benefits of Korean Patent Application No. 10-2022-0134459 under 35 U.S.C. § 119, filed on Oct. 18, 2022, in the Korean Intellectual Property Office, the entire contents of which are incorporated herein by reference.

BACKGROUND

1. Technical Field

One or more embodiments relate to a display apparatus and a method of manufacturing the display apparatus.

2. Description of the Related Art

Display apparatuses visually display data. Display apparatuses may provide images by using light-emitting diodes. Display apparatuses have been used for various purposes. Accordingly, various designs have been researched to improve the quality of display apparatuses.

SUMMARY

One or more embodiments provide a display apparatus capable of improving display quality and outgas sing efficiency and a method of manufacturing the display apparatus.

However, embodiments of the disclosure are not limited to those set forth herein. The above and other embodiments will become more apparent to one of ordinary skill in the art to which the disclosure pertains by referencing the detailed description of the disclosure given below.

According to one or more embodiments, a display apparatus may include a display area in which a plurality of light-emitting diodes are disposed, a common voltage supply line disposed in a non-display area outside the display area, an organic insulating layer disposed on the common voltage supply line, a connection electrode layer disposed on the organic insulating layer and electrically connected to the common voltage supply line, an insulating layer disposed on the connection electrode layer, and a metal bank layer electrically connected to the connection electrode layer through a contact hole of the insulating layer, wherein the metal bank layer may include a first hole overlapping the organic insulating layer, and each of the connection electrode layer and the insulating layer may include a hole overlapping the first hole of the metal bank layer.

The plurality of light-emitting diodes may include a first light-emitting diode disposed at an outermost portion of the display area, the first light-emitting diode includes a first sub-pixel electrode, a first intermediate layer overlapping the first sub-pixel electrode through a first emission opening of the metal bank layer, and a first counter electrode overlapping the first intermediate layer through the first emission opening of the metal bank layer, and the first counter electrode is electrically connected to the connection electrode layer through the metal bank layer.

The insulating layer may include an opening overlapping the first emission opening.

An edge portion of the first counter electrode may contact a side surface of the metal bank layer facing the first emission opening.

The display apparatus may further include an encapsulation layer disposed on the plurality of light-emitting diodes and including an organic encapsulation layer and an inorganic encapsulation layer, wherein the organic encapsulation layer extends to the non-display area, and a part of the organic encapsulation layer is disposed in the first hole of the metal bank layer, the hole of the insulating layer, and the hole of the connection electrode layer.

The insulating layer may contact the organic insulating layer, in an intermediate area between the display area and a first edge portion of the connection electrode layer close to the display area.

The metal bank layer may further include a second hole disposed in an intermediate area between the display area and a first edge portion of the connection electrode layer close to the display area.

A width of the second hole of the metal bank layer may be substantially equal to or greater than a width of the first hole of the metal bank layer.

The insulating layer may further include a hole overlapping the second hole of the metal bank layer.

The insulating layer may include an inorganic insulating material.

According to one or more embodiments, a display apparatus may include a first light-emitting diode disposed in a display area, and including a first sub-pixel electrode, a first intermediate layer, and a first counter electrode, a common voltage supply line disposed in a non-display area outside the display area, an organic insulating layer disposed on the common voltage supply line, a connection electrode layer electrically connected to the common voltage supply line and including a hole overlapping the organic insulating layer, and a metal bank layer electrically connected to the connection electrode layer and including a first hole overlapping the hole of the connection electrode layer, wherein the first counter electrode may be electrically connected to the common voltage supply line through the metal bank layer and the connection electrode layer.

The metal bank layer may include a first emission opening overlapping the first sub-pixel electrode, and the first counter electrode may contact a side surface of the metal bank layer facing the first emission opening.

The display apparatus may further include an encapsulation layer disposed on the first light-emitting diode, and including an organic encapsulation layer and an inorganic encapsulation layer, wherein the organic encapsulation layer extends to the non-display area, and a part of the organic encapsulation layer is disposed in the first hole of the metal bank layer.

The display apparatus may further include an insulating layer between the connection electrode layer and the metal bank layer, wherein the metal bank layer contacts the connection electrode layer through a contact hole of the insulating layer.

The insulating layer may include an opening overlapping the first sub-pixel electrode.

The insulating layer may include an inorganic insulating material.

A part of the insulating layer may be disposed in an intermediate area between a first edge portion of the connection electrode layer and the first sub-pixel electrode of the first light-emitting diode.

The metal bank layer may further include a second hole disposed in an intermediate area between a first edge portion of the connection electrode layer and the first sub-pixel electrode of the first light-emitting diode.

The insulating layer may extend to the intermediate area and may include a hole overlapping the second hole of the metal bank layer.

A width of the second hole of the metal bank layer may be substantially equal to or greater than a width of the first hole of the metal bank layer.

BRIEF DESCRIPTION OF THE DRAWINGS

The above and other aspects, features, and advantages of certain embodiments will be more apparent from the following description taken in conjunction with the accompanying drawings, in which:

FIGS. 7 and 8 are a schematic plan views illustrating a part of a display apparatus, corresponding to a portion III of FIG. 3 according to an embodiment; and FIG. 9 is a schematic cross-sectional view illustrating a part of a display apparatus according to an embodiment.

DETAILED DESCRIPTION OF THE EMBODIMENTS

Figure 1:
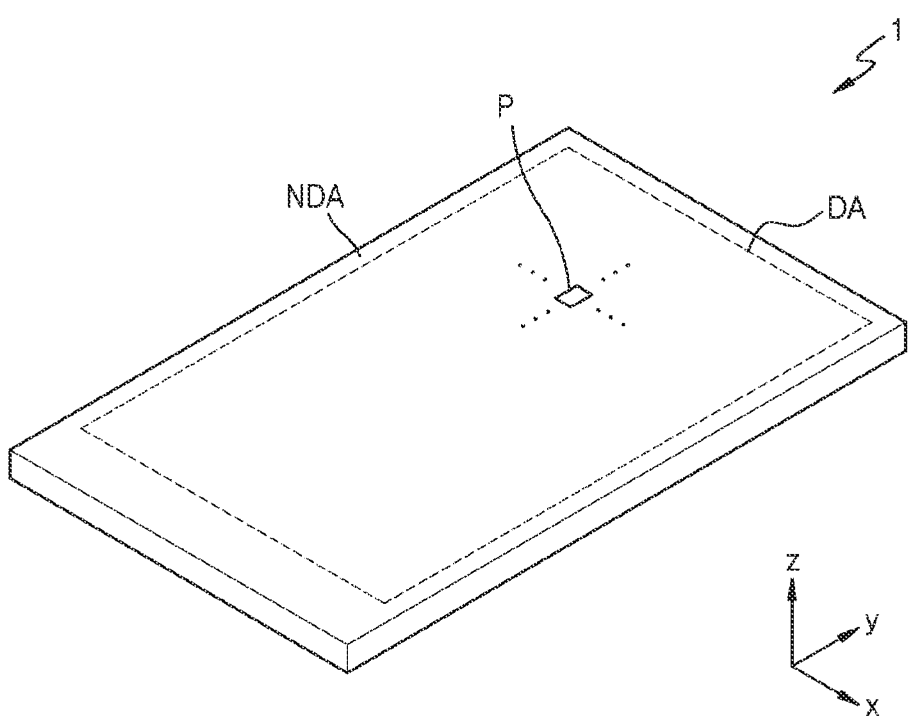
FIG. 1 is a schematic perspective view of a display apparatus according to an embodiment.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

Unless otherwise specified, the illustrated embodiments are to be understood as providing features of the invention. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the invention.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the X-axis, the Y-axis, and the Z-axis are not limited to three axes of a rectangular coordinate system, such as the x, y, and z axes, and may be interpreted in a broader sense. For example, the X-axis, the Y-axis, and the Z-axis may be perpendicular to one another, or may represent different directions that are not perpendicular to one another. For the purposes of this disclosure, "at least one of A and B" may be construed as understood to mean A only, B only, or any combination of A and B. Also, "at least one of X, Y, and Z" and "at least one selected from the group consisting of X, Y, and Z" may be construed as X only, Y only, Z only, or any combination of two or more of X, Y, and Z. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some embodiments may be physically separated into two or more interacting and discrete blocks, units, and/or modules without departing from the scope of the invention. Further, the blocks, units, and/or modules of some embodiments may be physically combined into more complex blocks, units, and/or modules without departing from the scope of the invention.

FIG. 1 is a schematic perspective view of a display apparatus according to an embodiment.

Referring to FIG. 1, a display apparatus 1 may include a display area DA and a non-display area NDA positioned outside the display area DA. The display area DA may display an image by sub-pixels P positioned in the display area DA. The non-display area NDA, which is positioned outside the display area DA and does not display an image, may surround (e.g., entirely surround) the display area DA. A driver or the like for applying an electrical signal or power to the display area DA may be positioned in the non-display area NDA. A pad to which an electronic element or a printed circuit board may be electrically connected may be positioned in the non-display area NDA.

In an embodiment, although the display area DA has a polygonal shape (e.g., a quadrangular shape) in which a length in an x-axis direction is less than a length in a y-axis direction in FIG. 1, in another example, the display apparatus 1 may include the display area DA having a polygonal shape (e.g., a quadrangular shape) in which a length in the y-axis direction is less than a length in the x-axis direction. Although the display area DA has a substantially quadrangular shape in FIG. 1, embodiments are not limited thereto. In another example, the display area DA may have any of various shapes such as a polygon with N sides, where N is a natural number equal to or greater than 3, a circular shape, or an elliptical shape. Although a corner portion of the display area DA has a shape including a vertex where a straight line and a straight line meet each other in FIG. 1, in another example, the display area DA may have a polygonal shape with round corners.

Although the display apparatus 1 is an electronic device that is a smartphone for convenience of explanation, embodiments are not limited thereto. The display apparatus 1 may be applied to any of various products such as a television, a laptop computer, a monitor, an advertisement board, an Internet of things (IoT) product as well as a portable electronic device such as a mobile phone, a smartphone, a tablet personal computer (PC), a mobile communication terminal, an electronic organizer, an electronic book, a portable multimedia player (PMP), a navigation device, or an ultra-mobile PC (UMPC). For example, the display apparatus 1 according to an embodiment may be used in a wearable device such as a smart watch, a watch phone, a glasses-type display, or a head-mounted display (HMD). For example, the display apparatus 1 according to an embodiment may be applied to a center information display (CID) positioned on an instrument panel, a center fascia, or a dashboard of a vehicle, a room mirror display replacing a side-view mirror of a vehicle, or a display screen positioned on the back of a front seat for entertainment for a passenger on the back seat of a vehicle.

Figure 2:
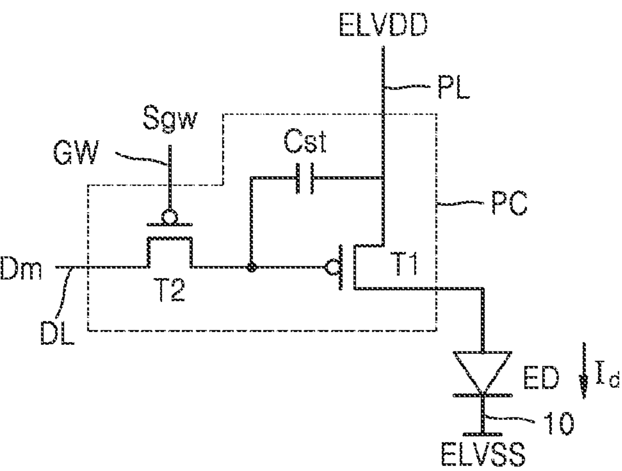
FIG. 2 is a schematic diagram of an equivalent circuit of a light-emitting diode of a representative sub-pixel of a display apparatus and a sub-pixel circuit electrically connected to the light-emitting diode according to an embodiment.

FIG. 2 is a schematic diagram of an equivalent circuit of a light-emitting diode corresponding to any one sub-pixel of a display apparatus and a sub-pixel circuit electrically connected to the light-emitting diode according to an embodiment.

Referring to FIG. 2, a light-emitting diode ED may be electrically connected to a sub-pixel circuit PC, and the sub-pixel circuit PC may include a first transistor T1, a second transistor T2, and a storage capacitor Cst. A sub-pixel electrode (e.g., an anode) of the light-emitting diode ED may be electrically connected to the first transistor T1, and a counter electrode (e.g., a cathode) may be electrically connected to a common voltage supply line 10 and may receive a voltage corresponding to a common voltage ELVSS.

The second transistor T2 may transmit a data signal Dm input through a data line DL to the first transistor T1 according to a scan signal Sgw input through a scan line GW.

The storage capacitor Cst may be electrically connected to the second transistor T2 and a driving voltage line PL, and may store a voltage corresponding to a difference between a voltage received from the second transistor T2 and a driving voltage ELVDD supplied to the driving voltage line PL.

The first transistor T1 may be electrically connected to the driving voltage line PL and the storage capacitor Cst, and may control driving current Id flowing from the driving voltage line PL to the light-emitting diode ED in response to a value of the voltage stored in the storage capacitor Cst. The light-emitting diode ED may emit light having a certain luminance according to the driving current Id.

Although the sub-pixel circuit PC includes two transistors and one storage capacitor in FIG. 2, embodiments are not limited thereto. In another example, the sub-pixel circuit PC of the display apparatus may include three or more transistors and may include two or more capacitors.

Figure 3:
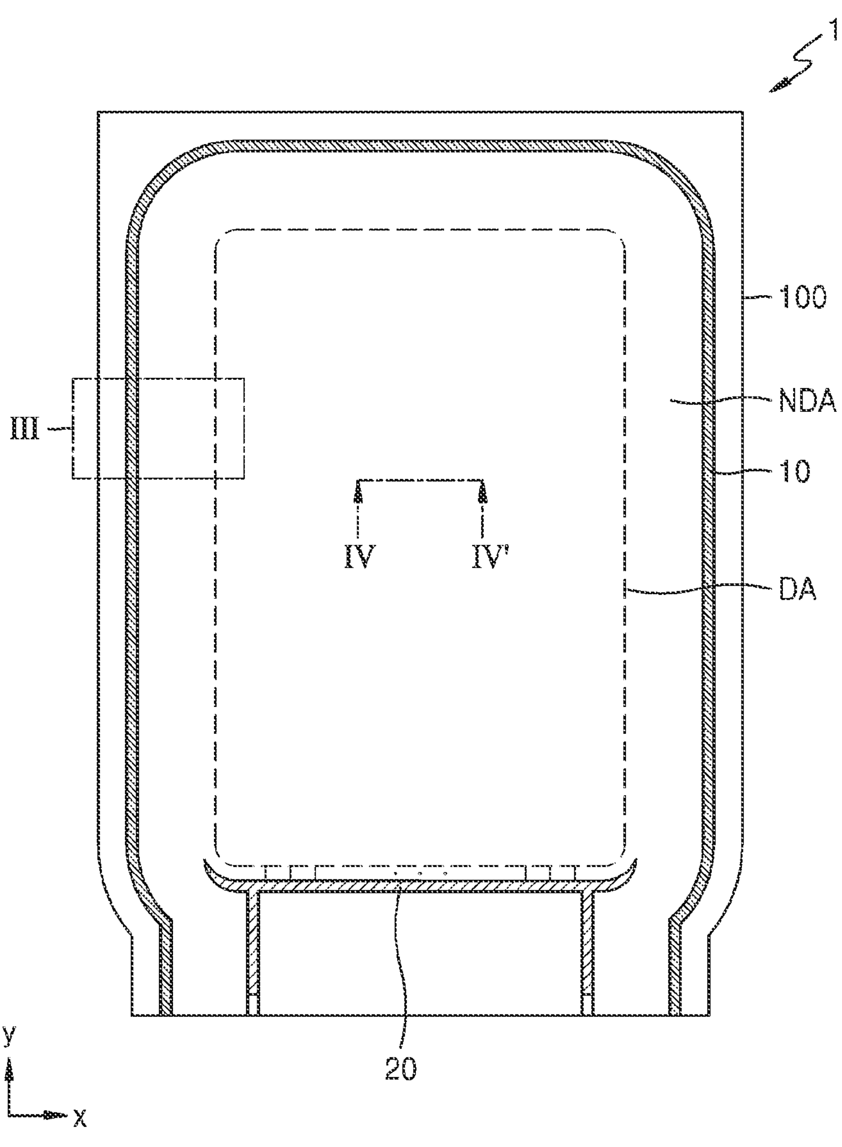
FIG. 3 is a schematic plan view of a display apparatus according to an embodiment.

FIG. 3 is a schematic plan view of a display apparatus according to an embodiment.

Referring to FIG. 3, the display apparatus 1 may include the display area DA and the non-display area NDA. A planar shape of the display apparatus 1 may be a shape of a substrate 100. For example, in case that the display apparatus 1 includes the display area DA and the non-display area NDA, it means that the substrate 100 includes the display area DA and the non-display area NDA. The display area DA may provide an image by light-emitting diodes positioned in the display area DA, and thus, may correspond to an image surface of the display apparatus 1.

In the non-display area NDA, the common voltage supply line 10 for providing a common voltage to counter electrodes (e.g., cathodes) of light-emitting diodes positioned in the display area DA may be positioned, and a driving voltage supply line 20 for providing a driving voltage to a pixel circuit may be positioned. The driving voltage supply line 20 may be electrically connected to the driving voltage line PL (see FIG. 2) positioned in the display area DA.

The common voltage supply line 10 may have a shape surrounding (e.g., partially surrounding) the display area DA. For example, the common voltage supply line 10 may have a closed loop shape with a side open (e.g., a single side open).

Figure 4:
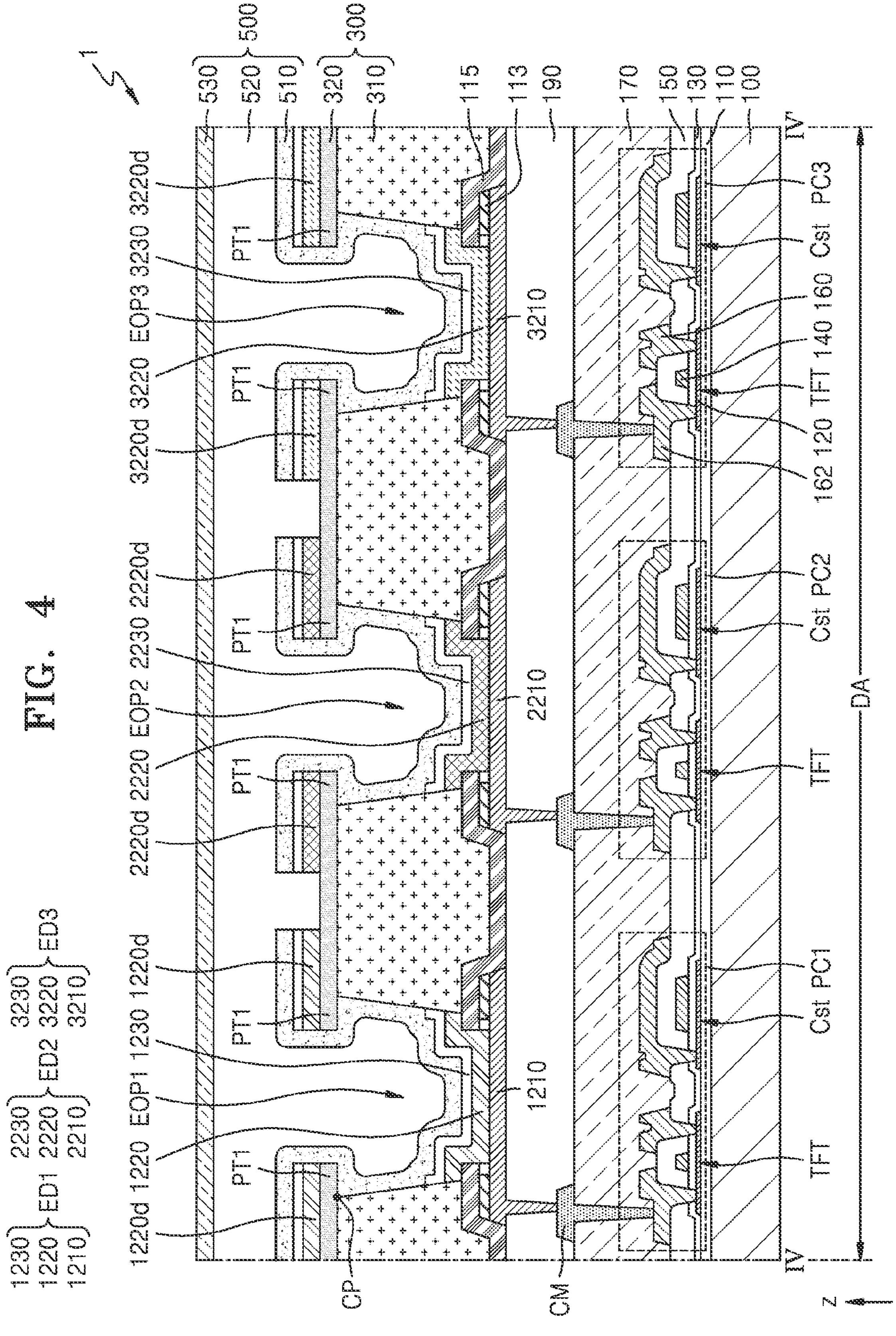
FIG. 4 is a schematic cross-sectional view, illustrating a part of the display apparatus, taken along line IV-IV' of FIG. 3 according to an embodiment.

FIG. 4 is a schematic cross-sectional view illustrating a part of the display apparatus, taken along line IV-IV' of FIG. 3 according to an embodiment.

Referring to FIG. 4, the display area DA may include light-emitting diodes, for example, first to third light-emitting diodes ED1, ED2, and ED3, positioned on the substrate 100. For example, the light-emitting diodes, for example, the first to third light-emitting diodes ED1, ED2, and ED3, may be positioned in the display area DA of the substrate 100.

The substrate 100 may include a glass material or a polymer resin. The substrate 100 may have a structure in which a base layer including a polymer resin and an inorganic barrier layer are stacked. Examples of the polymer resin may include polyethersulfone (PES), polyacrylate (PA), polyether imide (PEI), polyethylene naphthalate (PEN), polyethylene terephthalate (PET), polyphenylene sulfide (PPS), polyarylate (PAR), polyimide (PI), polycarbonate (PC), cellulose triacetate (TAC), and/or cellulose acetate propionate (CAP).

First to third sub-pixel circuits PC1, PC2, and PC3 may be positioned between the substrate 100 and the first to third light-emitting diodes ED1, ED2, and ED3, respectively. Each of the first to third sub-pixel circuits PC1, PC2, and PC3 may include a transistor and a storage capacitor as described with reference to FIG. 2. In an embodiment, in FIG. 4, each of the first to third sub-pixel circuits PC1, PC2, and PC3 may include a transistor TFT and a storage capacitor Cst. In an embodiment, the transistor TFT of FIG. 4 may correspond to the first transistor T1 of FIG. 2. In another example, in case that a transistor is additionally positioned between a sub-pixel electrode (e.g., an anode) of a light-emitting diode and the first transistor T1 in the sub-pixel circuit described with reference to FIG. 2, the added transistor may correspond to the transistor TFT of FIG. 4.

A buffer layer 110 may be positioned on a top surface (or upper surface) of the substrate 100. The buffer layer 110 may prevent penetration (or permeation) of impurities into a semiconductor layer of the transistor. The buffer layer 110 may include an inorganic insulating material such as silicon nitride, silicon oxynitride, or silicon oxide, and may have a single-layer structure or a multi-layer structure including the above inorganic insulating material.

The transistor TFT may include a semiconductor layer 120 on the buffer layer 110 and a gate electrode 140 overlapping a channel region of the semiconductor layer 120. The semiconductor layer 120 may include a silicon-based semiconductor material, for example, polysilicon. The semiconductor layer 120 may include the channel region and a first region and a second region positioned on sides (e.g., opposite sides) of the channel region. The first region and the second region may be regions having a higher impurity concentration than the channel region, and one of the first region and the second region may correspond to a source region and the other of the first region and the second region may correspond to a drain region.

A gate insulating layer 130 may be positioned between the semiconductor layer 120 and the gate electrode 140. The gate insulating layer 130 may include an inorganic insulating material such as silicon nitride, silicon oxynitride, or silicon oxide, and may have a single-layer structure or a multi-layer structure including the above inorganic insulating material.

A first interlayer insulating layer 150 may be positioned on the gate electrode 140. The first interlayer insulating layer 150 may include an inorganic insulating material such as silicon nitride, silicon oxynitride, or silicon oxide, and may have a single-layer structure or a multi-layer structure including the above inorganic insulating material.

A source electrode 160 and a drain electrode 162 may be electrically connected to the source region and the drain region of the semiconductor layer 120, respectively. A first organic insulating layer 170 may be positioned on the source electrode 160 and the drain electrode 162. The first organic insulating layer 170 may include an organic insulating material. The storage capacitor Cst may include a first capacitor electrode and a second capacitor electrode overlapping each other.

First to third sub-pixel electrodes 1210, 2210, and 3210 may be positioned on a second organic insulating layer 190 on the first organic insulating layer 170. Each of the first to third sub-pixel electrodes 1210, 2210, and 3210 may be electrically connected to the transistor TFT of a corresponding sub-pixel circuit through a connection metal layer CM.

Each of the first to third light-emitting diodes ED1, ED2, and ED3 electrically connected to the first to third sub-pixel circuits PC1, PC2, and PC3, respectively, may have a stacked structure of a sub-pixel electrode, an intermediate layer, and a counter electrode.

For example, the first light-emitting diode ED1 may include the first sub-pixel electrode 1210, a first intermediate layer 1220, and a first counter electrode 1230. The first sub-pixel electrode 1210 may be electrically connected to the first sub-pixel circuit PC1. The second light-emitting diode ED2 may include the second sub-pixel electrode 2210, a second intermediate layer 2220, and a second counter electrode 2230. The second sub-pixel electrode 2210 may be electrically connected to the second sub-pixel circuit PC2. The third light-emitting diode ED3 may include the third sub-pixel electrode 3210, a third intermediate layer 3220, and a third counter electrode 3230. The third sub-pixel electrode 3210 may be electrically connected to the third sub-pixel circuit PC3.

Each of the first intermediate layer 1220, the second intermediate layer 2220, and the third intermediate layer 3220 may include a first function layer, an emission layer, and a second functional layer. The first function layer may be positioned under the emission layer, and the second functional layer may be positioned over the emission layer. The first function layer and the second function layer may include an organic material. The first functional layer may include, for example, a hole transport layer (HTL) and/or a hole injection layer (HIL). The second functional layer may include an electron transport layer (ETL) and/or an electron injection layer (EIL).

The emission layer may include a high molecular weight organic material or a low molecular weight organic material emitting light of a certain color (e.g., red, green, or blue light). In another example, the emission layer may include an inorganic material or quantum dots.

Each of the first sub-pixel electrode 1210, the second sub-pixel electrode 2210, and the third sub-pixel electrode 3210 may include an inner portion and an outer portion surrounding the inner portion. An "outer portion (or peripheral portion)" of a sub-pixel electrode refers to a "portion of the sub-pixel electrode including an edge portion of the sub-pixel electrode", and an "inner portion of the sub-pixel electrode" refers to another portion of the sub-pixel electrode surrounded by the outer portion (or peripheral portion).

The first intermediate layer 1220 may overlap and contact the inner portion of the first sub-pixel electrode 1210, and the first counter electrode 1230 may overlap the first intermediate layer 1220. An insulating layer 115 may be positioned on the outer portion of the first sub-pixel electrode 1210. The insulating layer 115 may overlap the outer portion of the first sub-pixel electrode 1210, and may extend to the second organic insulating layer 190 to cover a side surface of the first sub-pixel electrode 1210. A protective layer 113 may be positioned between the insulating layer 115 and the outer portion of the first sub-pixel electrode 1210. Each of the insulating layer 115 and the protective layer 113 may be positioned on the outer portion of the first sub-pixel electrode 1210, and may not be positioned on the inner portion of the first sub-pixel electrode 1210. For example, each of the insulating layer 115 and the protective layer 113 may include an opening overlapping the inner portion of the first sub-pixel electrode 1210. Each of the insulating layer 115 and the protective layer 113 may include openings overlapping first to third emission openings EOP1, EOP2, and EOP3 of a metal bank layer 300 described below.

The insulating layer 115 may include an inorganic insulating material. The insulating layer 115 including an inorganic insulating material may prevent or minimize degradation of the quality of a light-emitting diode due to gas emitted from an insulating layer formed of an organic insulating material during a process of manufacturing a display apparatus, compared to the insulating layer 115 including an organic insulating material. In an embodiment, the insulating layer 115 may have a two-layer structure including a silicon oxide layer and a silicon nitride layer. A thickness of the silicon oxide layer may be less than a thickness of the silicon nitride layer. In some embodiments, a thickness of the insulating layer 115 may be greater than a thickness of the protective layer 113. For example, a thickness of the insulating layer 115 may be about 1,000 Å and a thickness of the protective layer 113 may be about 500 Å, but embodiments are not limited thereto.

The protective layer 113 may include a conductive oxide such as indium tin oxide (ITO), indium zinc oxide (IZO), indium gallium zinc oxide (IGZO), indium tin zinc oxide (ITZO), zinc oxide (ZnO), aluminum doped zinc oxide (AZO), gallium doped zinc oxide (GZO), zinc tin oxide (ZTO), gallium tin oxide (GTO), or fluorine doped tin oxide (FTO).

The second intermediate layer 2220 may overlap and contact the inner portion of the second sub-pixel electrode 2210, and the second counter electrode 2230 may overlap the second intermediate layer 2220. The outer portion of the second sub-pixel electrode 2210 may overlap the insulating layer 115. The third intermediate layer 3220 may overlap and contact the inner portion of the third sub-pixel electrode 3210, and the third counter electrode 3230 may overlap the third intermediate layer 3220. The outer portion of the third sub-pixel electrode 3210 may overlap the insulating layer 115. The insulating layer 115 may overlap the outer portion of each of the second sub-pixel electrode 2210 and the third sub-pixel electrode 3210, and may extend to the second organic insulating layer 190 to cover a side surface of each of the second sub-pixel electrode 2210 and the third sub-pixel electrode 3210. The protective layer 113 may be positioned between the insulating layer 115 and the outer portion of the second sub-pixel electrode 2210, and the protective layer 113 may be positioned between the insulating layer 115 and the outer portion of the third sub-pixel electrode 3210.

The metal bank layer 300 may include the first to third emission openings EOP1, EOP2, and EOP3 respectively overlapping the first to third sub-pixel electrodes 1210, 2210, and 3210. The metal bank layer 300 may include a first metal layer 310 and a second metal layer 320 on the first metal layer 310. The first metal layer 310 and the second metal layer 320 may include different metals. For example, the first metal layer 310 and the second metal layer 320 may include metals having different etch selectivities. In an embodiment, the first metal layer 310 may be a layer including aluminum (Al), and the second metal layer 320 may be a layer including titanium (Ti).

A thickness of the first metal layer 310 may be greater than a thickness of the second metal layer 320. In an embodiment, a thickness of the first metal layer 310 may be about five times greater than a thickness of the second metal layer 320. In another example, a thickness of the first metal layer 310 may be about six times greater than a thickness of the second metal layer 320, or may be about seven times or eight times greater than a thickness of the second metal layer 320. In an embodiment, a thickness of the first metal layer 310 may be in a range of about 4,000 Å to about 8,000 Å, and a thickness of the second metal layer 320 may be in a range of about 500 Å to about 800 Å. A thickness of the first metal layer 310 may be about four times or more, five times or more, or six times or more greater than a thickness of the insulating layer 115.

Each of the first to third emission openings EOP1, EOP2, and EOP3 of the metal bank layer 300 may penetrate from a top surface (or upper surface) to a bottom surface (or lower surface) of the metal bank layer 300, and may have an undercut-shaped structure in a cross-sectional view.

Each of the first to third emission openings EOP1, EOP2, and EOP3 may overlap openings of the first and second metal layers 310 and 320. A part of the second metal layer 320 defining the opening of the second metal layer 320 may protrude from a point CP where a side surface of the first metal layer 310 facing the opening of the first metal layer 310 and a bottom surface (or lower surface) of the second metal layer 320 meet each other toward the first emission opening EOP1, to have an undercut structure. The part of the second metal layer 320 further protruding toward the first emission opening EOP1 may correspond to a first tip PT1. A length of the first tip PT1, for example, a length from the point CP to an edge portion (or side surface) of the first tip PT1, may be about 2 μm or less. In some embodiments, a length of the first tip PT1 of the second metal layer 320 may be in a range of about 0.3 μm to about 1 μm or in a range of about 0.3 μm to about 0.7 μm.

Due to the undercut structure of each of the first to third emission openings EOP1, EOP2, and EOP3, a dummy intermediate layer may be positioned on the metal bank layer 300. For example, a first dummy intermediate layer 1220*d* may be positioned on the metal bank layer 300 surrounding the first intermediate layer 1220 positioned on the first sub-pixel electrode 1210 through the first emission opening EOP1. Likewise, a second dummy intermediate layer 2220*d* may be positioned on the metal bank layer 300 surrounding the second intermediate layer 2220 positioned on the second sub-pixel electrode 2210 through the second emission opening EOP2. A third dummy intermediate layer 3220*d* may be positioned on the metal bank layer 300 surrounding the third intermediate layer 3220 positioned on the third sub-pixel electrode 3210 through the third emission opening EOP3.

An encapsulation layer 500 may be positioned on the first to third light-emitting diodes ED1, ED2, and ED3. In an embodiment, the encapsulation layer 500 may include a first inorganic encapsulation layer 510, an organic encapsulation layer 520, and a second inorganic encapsulation layer 530. The first inorganic encapsulation layer 510 may be patterned to overlap each light-emitting diode. For example, the first inorganic encapsulation layer 510 overlapping the first light-emitting diode ED1, the first inorganic encapsulation layer 510 overlapping the second light-emitting diode ED2, and the first inorganic encapsulation layer 510 overlapping the third light-emitting diode ED3 may be separated and spaced apart from each other. The first inorganic encapsulation layer 510 may include at least one inorganic material selected from among aluminum oxide, titanium oxide, tantalum oxide, hafnium oxide, zinc oxide, silicon oxide, silicon nitride, and silicon oxynitride.

The organic encapsulation layer 520 may continuously cover the first to third light-emitting diodes ED1, ED2, and ED3, unlike the first inorganic encapsulation layer 510. The organic encapsulation layer 520 may include a polymer-based material. Examples of the polymer-based material may include an acrylic resin, an epoxy resin, polyimide, and polyethylene. In an embodiment, the organic encapsulation layer 520 may include acrylate.

The second inorganic encapsulation layer 530 may be positioned on the organic encapsulation layer 520, and may include at least one inorganic material selected from among aluminum oxide, titanium oxide, tantalum oxide, hafnium oxide, zinc oxide, silicon oxide, silicon nitride, and silicon oxynitride.

Figure 5:
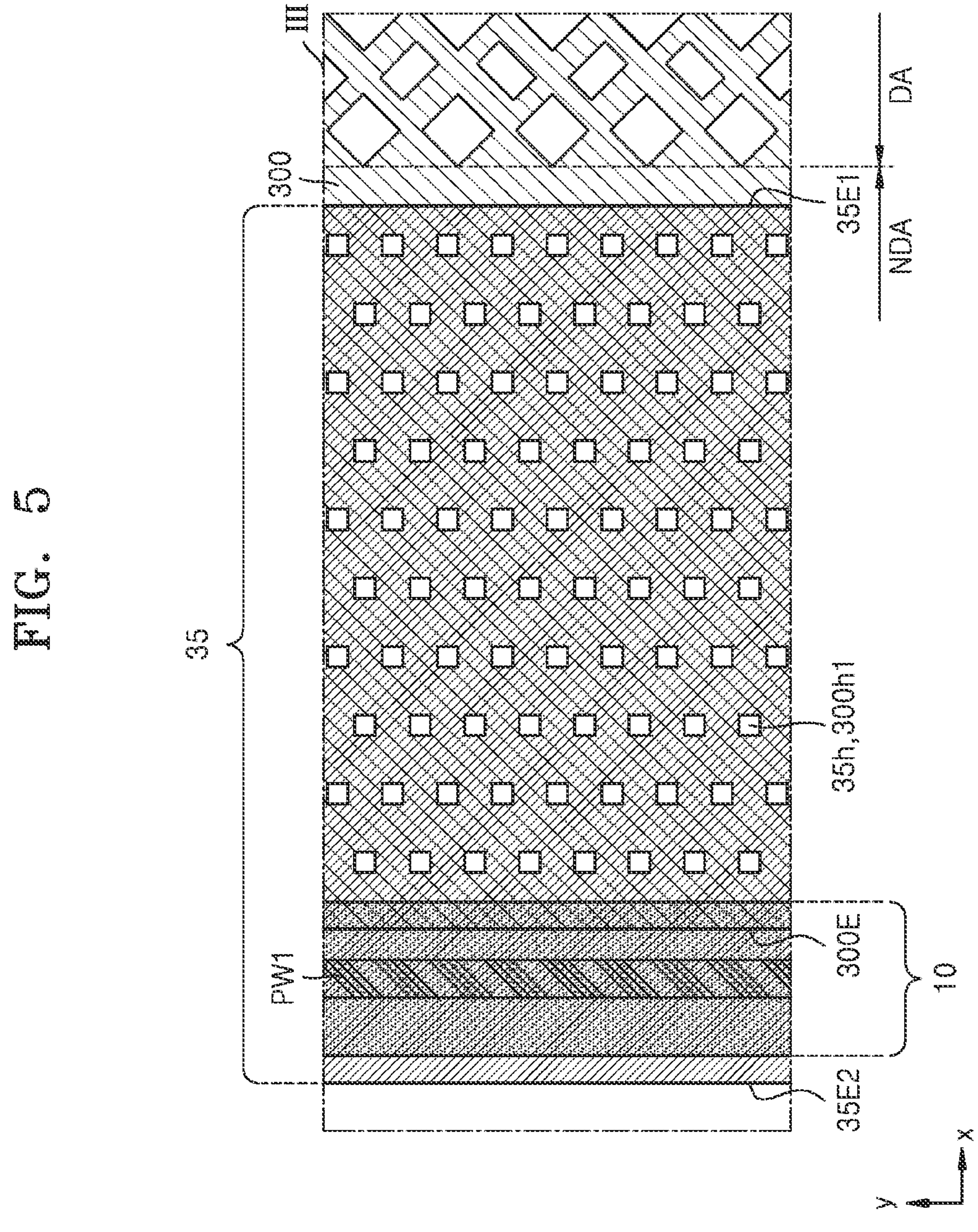
FIG. 5 is a schematic plan view illustrating a part of a display apparatus, corresponding to a portion III of FIG. 3 according to an embodiment.

FIG. 5 is a schematic plan view illustrating a part of a display apparatus, corresponding to a portion III of FIG. 3 according to an embodiment.

Referring to FIG. 5, the common voltage supply line 10 may be positioned in the non-display area NDA, and a connection electrode layer 35 may overlap the common voltage supply line 10. A first edge portion 35E1 of the connection electrode layer 35 may be positioned close to the display area DA, and a second edge portion 35E2 may be positioned opposite to the first edge portion 35E1 and may be positioned far from the display area DA.

A first wall (or first partition wall) PW1 may be positioned in the non-display area NDA. The first wall PW1 may overlap the common voltage supply line 10.

The metal bank layer 300 may extend to the non-display area NDA. An edge portion 300E (e.g., outer edge) of the metal bank layer 300 may be positioned closer to the display area DA than the first wall PW1. The metal bank layer 300 may overlap the connection electrode layer 35 in the non-display area NDA. The metal bank layer 300 may include a first hole (or first exhaust hole) 300*h*1 for discharging gas generated in an organic insulating layer positioned under and overlapping the metal bank layer 300 in the non-display area NDA. The first hole 300*h*1 of the metal bank layer 300 may overlap a hole (or exhaust hole) 35*h* formed in the connection electrode layer 35 under the metal bank layer 300.

Figure 6:
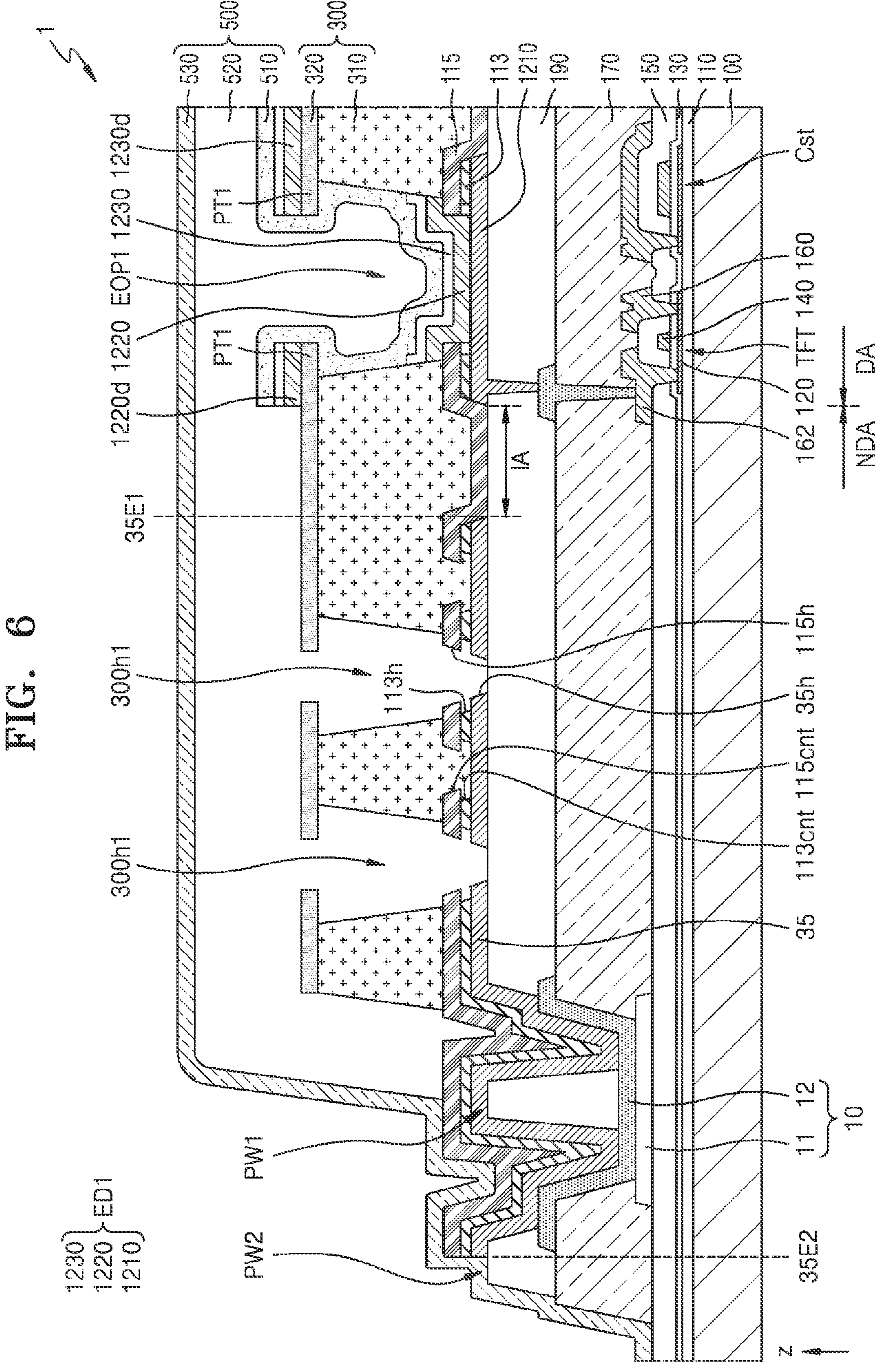
FIG. 6 is a schematic cross-sectional view illustrating a part of a display apparatus according to an embodiment.

FIG. 6 is a schematic cross-sectional view illustrating a part of a display apparatus according to an embodiment.

Light-emitting diodes may be positioned in the display area DA, and in this regard, FIG. 6 illustrates the first light-emitting diode ED1 positioned in the display area DA. Specific structures of the first light-emitting diode ED1 and the transistor TFT and the storage capacitor Cst electrically connected to the first light-emitting diode ED1 are the same as those described with reference to FIG. 4. The redundant description thereof will be omitted for descriptive convenience.

The common voltage supply line 10 may be positioned on an inorganic insulating layer in the non-display area NDA. In this regard, in FIG. 6, the common voltage supply line 10 is positioned on the buffer layer 110, the gate insulating layer 130, and the first interlayer insulating layer 150.

The common voltage supply line 10 may include a first sub-common voltage supply line 11 and a second sub-common voltage supply line 12. Each of the first sub-common voltage supply line 11 and the second sub-common voltage supply line 12 may include aluminum (Al), copper (Cu), or titanium (Ti), and may have a single-layer structure or a multi-layer structure. The first sub-common voltage supply line 11 may be positioned under the first organic insulating layer 170, and the second sub-common voltage supply line 12 may be positioned over the first organic insulating layer 170. The second sub-common voltage supply line 12 may contact (e.g., directly contact) a top surface (or upper surface) of the first sub-common voltage supply line 11 through a contact hole formed in the first organic insulating layer 170. Edges (e.g., opposite edges) of the first sub-common voltage supply line 11 may be covered by the first organic insulating layer 170.

The connection electrode layer 35 may be positioned on the second organic insulating layer 190. The connection electrode layer 35 may include the same material as that of a sub-pixel electrode, for example, the first sub-pixel electrode 1210.

The connection electrode layer 35 and the sub-pixel electrode, for example, the first sub-pixel electrode 1210, may be formed together in the same process. In some embodiments, the protective layer 113 and the insulating layer 115 may be positioned on the connection electrode layer 35. The insulating layer 115 may extend to the non-display area NDA and may overlap a top surface (or upper surface) of the first sub-pixel electrode 1210, and may contact (e.g., directly contact) a part of a top surface of the second organic insulating layer 190 in the non-display area NDA to cover the first edge portion 35E1 of the connection electrode layer 35. For example, the insulating layer 115 may extend to a top surface (or upper surface) of the connection electrode layer 35 and may cover a side surface of the connection electrode layer 35 corresponding to the first edge portion 35E1 of the connection electrode layer 35.

The connection electrode layer 35 may include holes 35*h* overlapping the second organic insulating layer 190. For example, the connection electrode layer 35 may include the holes 35*h* exposing a part of the top surface (or upper surface) of the second organic insulating layer 190. The protective layer 113 and the insulating layer 115 may respectively include holes 113*h* and 115*h* overlapping the hole 35*h* of the connection electrode layer 35. The hole 35*h* of the connection electrode layer 35, the hole 113*h* of the protective layer 113, and the hole 115*h* of the insulating layer 115 may overlap each other.

The protective layer 113 and the insulating layer 115 on the connection electrode layer 35 may respectively include contact holes 113*cnt* and 115*cnt* exposing the top surface (or upper surface) of the connection electrode layer 35. The metal bank layer 300 may extend to the non-display area NDA, and may be electrically connected to the connection electrode layer 35. For example, a part of the metal bank layer 300 may contact (e.g., directly contact) the connection electrode layer 35 through the contact hole 113*cnt* of the protective layer 113 and the contact hole 115*cnt* of the insulating layer 115.

The metal bank layer 300 may include the first hole 300*h*1 overlapping the hole 35*h* of the connection electrode layer 35. The first hole 300*h*1 of the metal bank layer 300 may overlap the hole 35*h* of the connection electrode layer 35, the hole 113*h* of the protective layer 113, and the hole 115*h* of the insulating layer 115. The first hole 300*h*1 of the metal bank layer 300 may pass through each of the first metal layer 310 and the second metal layer 320. In some embodiments, the first hole 300*h*1 of the metal bank layer 300 may have an undercut shape in a cross-sectional view, like the first emission opening EOP1.

A material included in an organic insulating layer, for example, the first and second organic insulating layers 170 and 190, may be vaporized and discharged to the outside through the first hole 300*h*1 of the metal bank layer 300 and the hole 35*h* of the connection electrode layer 35. Each of the first hole 300*h*1 of the metal bank layer 300 and the hole 35*h* of the connection electrode layer 35 may provide a path through which gas included in the organic insulating layer, for example, the first and second organic insulating layers 170 and 190, is discharged. In some embodiments, in case that the protective layer 113 and the insulating layer 115 are positioned on the connection electrode layer 35, the protective layer 113 and the insulating layer 115 may include the holes 113*h* and 115*h*, to improve outgas sing efficiency.

Although the metal bank layer 300 includes portions that are separated by the first hole 300*h*1 in FIG. 6, the metal bank layer 300 may have a structure (e.g., a mesh structure) including the first holes 300*h*1 arranged to be spaced apart from each other in a first direction (e.g., x-axis direction) and a second direction (e.g., y-axis direction) as shown in FIG. 5. Accordingly, the metal bank layer 300 may be electrically connected to the connection electrode layer 35.

The connection electrode layer 35 may be electrically connected to the common voltage supply line 10 through an opening of the second organic insulating layer 190 as shown in FIG. 6. For example, the connection electrode layer 35 may contact (e.g., directly contact) the second sub-common voltage supply line 12 through the opening of the second organic insulating layer 190. The metal bank layer 300 may be electrically connected to the first to third counter electrodes 1230, 2230, and 3230 as described with reference to FIG. 4. Through the above structure, a common voltage supplied by the common voltage supply line 10 may be supplied to the first to third counter electrodes 1230, 2230, and 3230 through the connection electrode layer 35 and the metal bank layer 300.

The encapsulation layer 500 may include the first inorganic encapsulation layer 510, and as described with reference to FIG. 4, the first inorganic encapsulation layer 510 may overlap the first light-emitting diode ED1 in the display area DA and may not extend to the non-display area NDA.

The organic encapsulation layer 520 may be positioned in the display area DA and the non-display area NDA. In some embodiments, in the non-display area NDA, the first wall PW1 and a second wall (or second partition wall) PW2 may be positioned, and an edge portion of the organic encapsulation layer 520 may be positioned adjacent to any one of the first wall PW1 and the second wall PW2. Referring to FIG. 6, the first wall PW1 overlaps the common voltage supply line 10, and the second wall PW2 is positioned far from the display area DA with the first wall PW1 therebetween. Each of the first wall PW1 and the second wall PW2 may include the same material as that of the organic insulating layer, for example, the second organic insulating layer 190.

A part of the organic encapsulation layer 520 may be positioned in the first hole 300*h*1 of the metal bank layer 300. For example, a part of the organic encapsulation layer 520 may be positioned in the first hole 300*h*1 of the metal bank layer 300, the hole 115*h* of the insulating layer 115, the hole 113*h* of the protective layer 113, and the hole 35*h* of the connection electrode layer 35. A part of the organic encapsulation layer 520 may contact (e.g., directly contact) the top surface (or upper surface) of the second organic insulating layer 190 through the first hole 300*h*1 of the metal bank layer 300, the hole 115*h* of the insulating layer 115, the hole 113*h* of the protective layer 113, and the hole 35*h* of the connection electrode layer 35.

The second inorganic encapsulation layer 530 may be positioned on the organic encapsulation layer 520, and may extend toward an edge portion of the substrate 100 to cover the first wall PW1 and the second wall PW2. In some embodiments, the second inorganic encapsulation layer 530 may contact (e.g., directly contact) a top surface (or upper surface) of the insulating layer 115.

Figure 7:
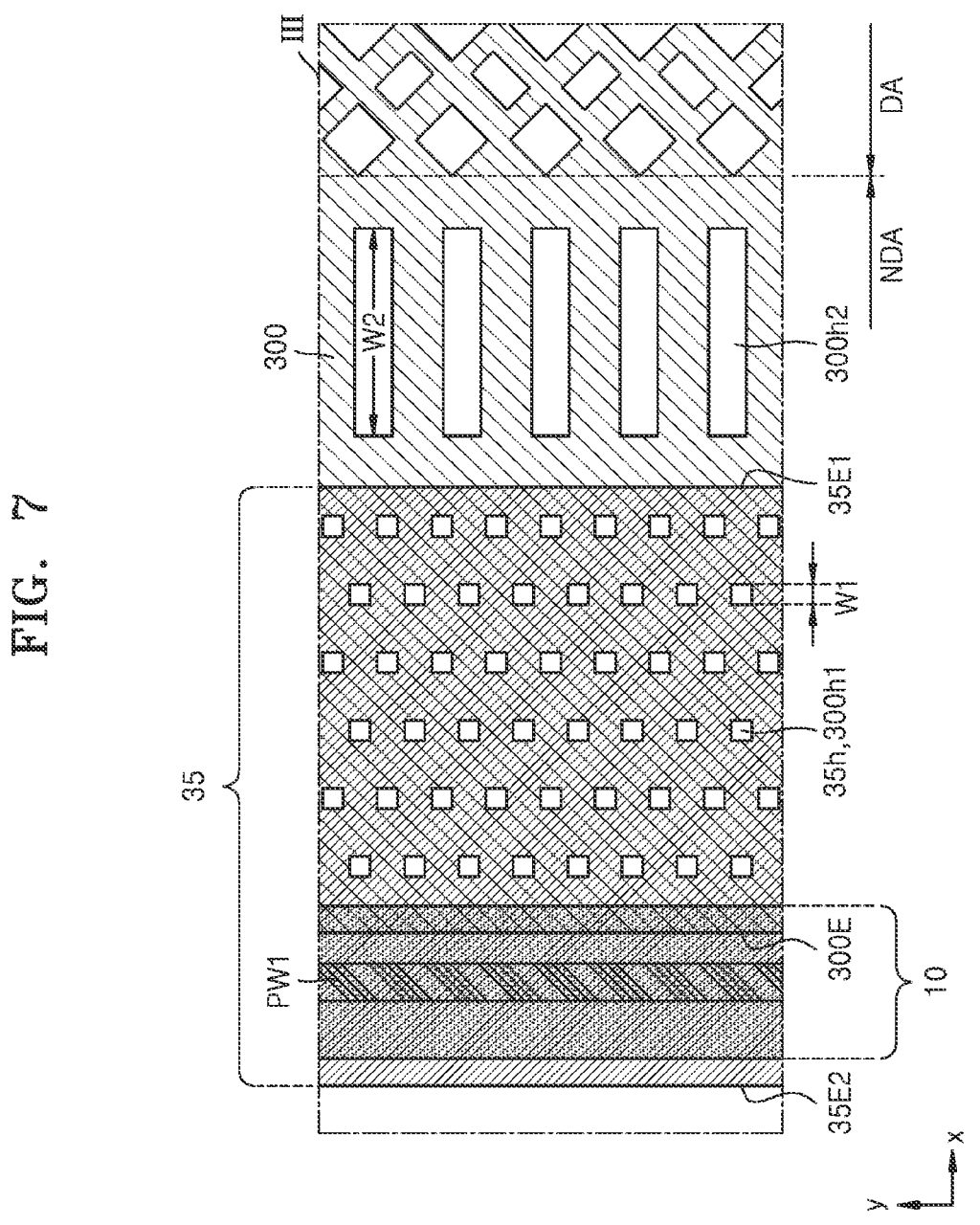
Figure 8:
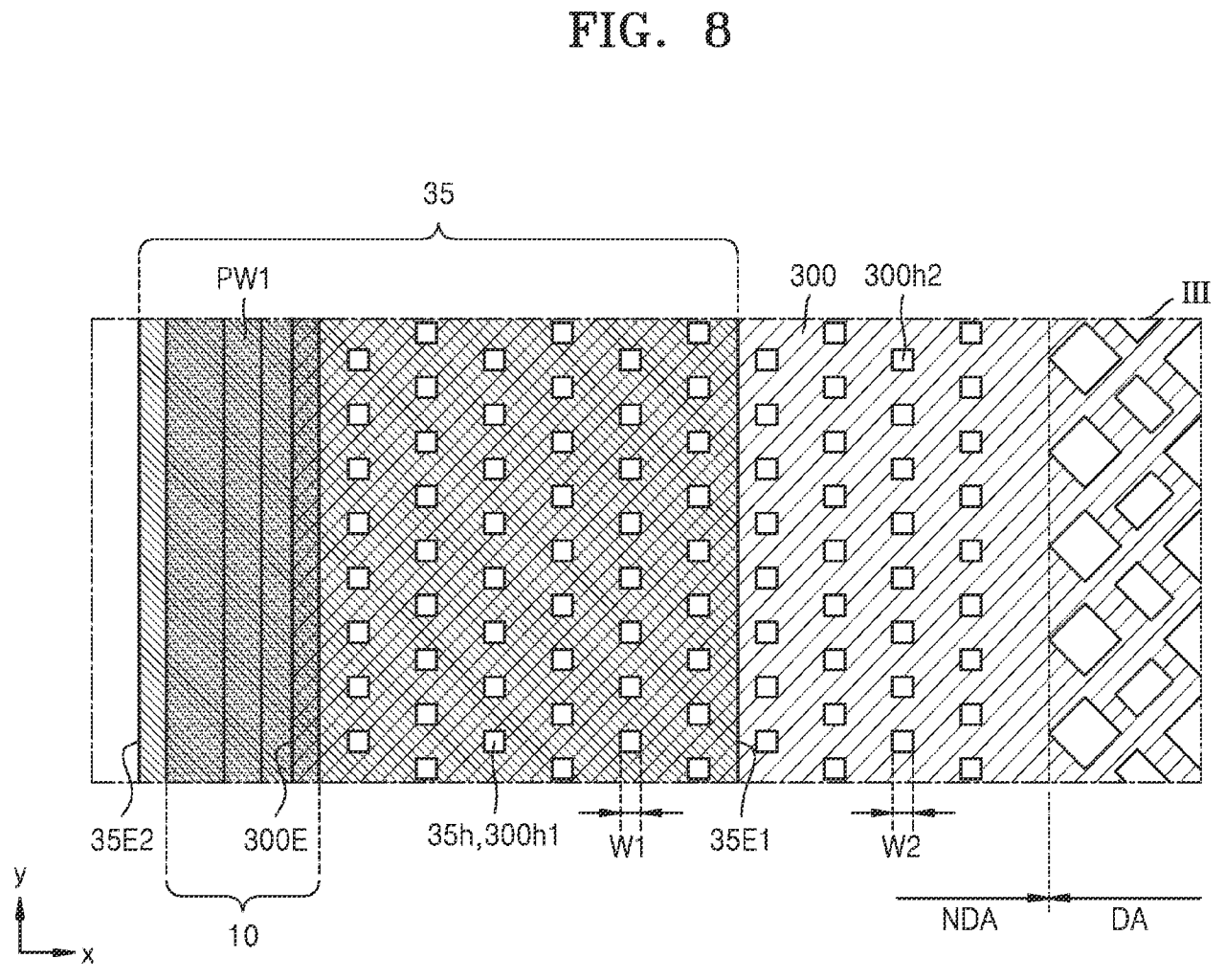

FIGS. 7 and 8 are schematic plan views illustrating a part of a display apparatus, corresponding to a portion III of FIG. 3 according to an embodiment.

Referring to FIGS. 7 and 8, the common voltage supply line 10 may be positioned in the non-display area NDA, and the connection electrode layer 35 may overlap the common voltage supply line 10. The first edge portion 35E1 of the connection electrode layer 35 may be positioned close to the display area DA, and the second edge portion 35E2 may be positioned opposite to the first edge portion 35E1 and may be positioned far from the display area DA.

The metal bank layer 300 may extend to the non-display area NDA. The edge portion 300E (e.g., outer edge) of the metal bank layer 300 may be positioned inside the first wall PW1. The metal bank layer 300 may overlap the connection electrode layer 35 in the non-display area NDA. The metal bank layer 300 may include the first hole 300*h*1 for discharging gas generated in an organic insulating layer positioned under and overlapping the metal bank layer 300 in the non-display area NDA. The first hole 300*h*1 of the metal bank layer 300 may overlap the hole (or exhaust hole) 35*h* formed in the connection electrode layer 35 under the metal bank layer 300.

The metal bank layer 300 may include a second hole 300*h*2 positioned in an area between the first edge portion 35E1 of the connection electrode layer 35 and the display area DA. A width W2 of the second hole 300*h*2 may be greater than a width W1 of the first hole 300*h*1 of the metal bank layer 300 as shown in FIG. 7. In another example, the width W2 of the second hole 300*h*2 may be substantially the same as the width W1 of the first hole 300*h*1 of the metal bank layer 300 as shown in FIG. 8.

An arrangement of the second holes 300*h*2 of the metal bank layer 300 may be different from an arrangement of the first holes 300*h*1 of the metal bank layer 300 as shown in FIG. 7. For example, the second holes 300*h*2 of the metal bank layer 300 may be arranged in a substantially stripe shape.

In another example, an arrangement of the second holes 300*h*2 of the metal bank layer 300 may be substantially the same as an arrangement of the first holes 300*h*1 of the metal bank layer 300, as shown in FIG. 8. For example, two second holes 300*h*2 spaced apart from each other in the second direction (e.g., y-axis direction) may be arranged to form an acute triangle with one second hole 300*h*2 spaced apart in the first direction (e.g., x-axis direction) from a virtual line that connects the two second holes 300*h*2.

FIG. 9 is a schematic cross-sectional view illustrating a part of a display apparatus according to an embodiment.

The display apparatus 1 of FIG. 9 may have substantially the same structure as that described with reference to FIG. 6. According to an embodiment of FIG. 9, there is a difference in that a width of an intermediate area IA between the first edge portion 35E1 of the connection electrode layer 35 and the display area DA (e.g., the first sub-pixel electrode 1210) may be greater than a width of the intermediate area IA in FIG. 6, and the second hole 300*h*2 of the metal bank layer 300 is positioned in the intermediate area IA. In FIG. 9, the same elements as those in FIG. 6 are not described, and a difference will be mainly described.

The metal bank layer 300 may include the second hole 300*h*2 positioned in the intermediate area IA. The insulating layer 115 under the metal bank layer 300 may extend to the non-display area NDA through a side surface of the first sub-pixel electrode 1210 and may overlap an outer portion of the first sub-pixel electrode 1210, and may contact (e.g., directly contact) a part of a top surface (or upper surface) of the second organic insulating layer 190 in the non-display area NDA to cover the first edge portion 35E1 of the connection electrode layer 35. The insulating layer 115 may include a hole 115*h*' overlapping the second hole 300*h*2 of the metal bank layer 300.

For example, a part of the insulating layer 115 may contact (e.g., directly contact) a part of the top surface (or upper surface) of the second organic insulating layer 190 in the intermediate area IA, but may include the hole 115*h*' through which another part of the top surface (or upper surface) of the second organic insulating layer 190 is exposed.

A part of the organic encapsulation layer 520 may be positioned in the second hole 300*h*2 of the metal bank layer 300. For example, a part of the organic encapsulation layer 520 may contact (e.g., directly contact) the top surface (or upper surface) of the second organic insulating layer 190 through the second hole 300*h*2 of the metal bank layer 300 and the hole 115*h*' of the insulating layer 115 overlapping each other.

According to a design of the display apparatus 1, because a width of the intermediate area IA is large and the metal bank layer 300 includes the second hole 300*h*2, outgassing efficiency of a material (e.g., impurities) included in an organic insulating layer, for example, the first and second organic insulating layers 170 and 190, may be improved.

According to an embodiment, because an intermediate layer is formed by using a metal bank layer having an undercut shape in a display area, a mask for forming the intermediate layer is not required, thereby preventing damage to a display apparatus due to the mask. For example, a counter electrode and a common voltage supply line may be electrically connected by using the metal bank layer and a connection electrode layer, and outgas sing of an organic insulating layer may be effectively performed by forming a hole in the metal bank layer.

In concluding the detailed description, those skilled in the art will appreciate that many variations and modifications may be made to the embodiments without substantially departing from the principles and spirit and scope of the disclosure. Therefore, the disclosed embodiments are used in a generic and descriptive sense only and not for purposes of limitation.

What is claimed is:

1. A display apparatus comprising:

a display area in which a plurality of light-emitting diodes are disposed;

a common voltage supply line disposed in a non-display area outside the display area;

an organic insulating layer disposed on the common voltage supply line;

a connection electrode layer disposed on the organic insulating layer and electrically connected to the common voltage supply line;

an insulating layer disposed on the connection electrode layer; and a metal bank layer electrically connected to the connection electrode layer through a contact hole of the insulating layer, wherein the metal bank layer comprises a first hole overlapping the organic insulating layer, and each of the connection electrode layer and the insulating layer comprises a hole overlapping the first hole of the metal bank layer.

2. The display apparatus of claim 1, wherein the plurality of light-emitting diodes comprise a first light-emitting diode disposed at an outermost portion of the display area, the first light-emitting diode comprises:

a first sub-pixel electrode;

a first intermediate layer overlapping the first sub-pixel electrode through a first emission opening of the metal bank layer; and a first counter electrode overlapping the first intermediate layer through the first emission opening of the metal bank layer, and the first counter electrode is electrically connected to the connection electrode layer through the metal bank layer.

3. The display apparatus of claim 2, wherein the insulating layer comprises an opening overlapping the first emission opening of the metal bank layer.

4. The display apparatus of claim 2, wherein an edge portion of the first counter electrode contacts a side surface of the metal bank layer facing the first emission opening of the metal bank layer.

5. The display apparatus of claim 1, further comprising:

an encapsulation layer disposed on the plurality of light-emitting diodes and comprising an organic encapsulation layer and an inorganic encapsulation layer, wherein the organic encapsulation layer extends to the non-display area, and a part of the organic encapsulation layer is disposed in the first hole of the metal bank layer, the hole of the insulating layer, and the hole of the connection electrode layer.

6. The display apparatus of claim 1, wherein the insulating layer contacts the organic insulating layer in an intermediate area between the display area and a first edge portion of the connection electrode layer that is close to the display area.

7. The display apparatus of claim 1, wherein the metal bank layer further comprises a second hole disposed in an intermediate area between the display area and a first edge portion of the connection electrode layer close to the display area.

8. The display apparatus of claim 7, wherein a width of the second hole of the metal bank layer is substantially equal to or greater than a width of the first hole of the metal bank layer.

9. The display apparatus of claim 7, wherein the insulating layer further comprises a hole overlapping the second hole of the metal bank layer.

10. The display apparatus of claim 1, wherein the insulating layer comprises an inorganic insulating material.

11. A display apparatus comprising:

a first light-emitting diode disposed in a display area, and comprising a first sub-pixel electrode, a first intermediate layer, and a first counter electrode;

a common voltage supply line disposed in a non-display area outside the display area;

an organic insulating layer disposed on the common voltage supply line;

a connection electrode layer electrically connected to the common voltage supply line and comprising a hole overlapping the organic insulating layer; and a metal bank layer electrically connected to the connection electrode layer and comprising a first hole overlapping the hole of the connection electrode layer, wherein the first counter electrode is electrically connected to the common voltage supply line through the metal bank layer and the connection electrode layer.

12. The display apparatus of claim 11, wherein the metal bank layer comprises a first emission opening overlapping the first sub-pixel electrode, and the first counter electrode contacts a side surface of the metal bank layer facing the first emission opening.

13. The display apparatus of claim 11, further comprising:

an encapsulation layer disposed on the first light-emitting diode, and comprising an organic encapsulation layer and an inorganic encapsulation layer, wherein the organic encapsulation layer extends to the non-display area, and a part of the organic encapsulation layer is disposed in the first hole of the metal bank layer.

14. The display apparatus of claim 11, further comprising:

an insulating layer between the connection electrode layer and the metal bank layer, wherein the metal bank layer contacts the connection electrode layer through a contact hole of the insulating layer.

15. The display apparatus of claim 14, wherein the insulating layer comprises an opening overlapping the first sub-pixel electrode.

16. The display apparatus of claim 14, wherein the insulating layer comprises an inorganic insulating material.

17. The display apparatus of claim 14, wherein a part of the insulating layer is disposed in an intermediate area between a first edge portion of the connection electrode layer and the first sub-pixel electrode of the first light-emitting diode.

18. The display apparatus of claim 14, wherein the metal bank layer further comprises a second hole disposed in an intermediate area between a first edge portion of the connection electrode layer and the first sub-pixel electrode of the first light-emitting diode.

19. The display apparatus of claim 18, wherein the insulating layer extends to the intermediate area and comprises a hole overlapping the second hole of the metal bank layer.

20. The display apparatus of claim 18, wherein a width of the second hole of the metal bank layer is substantially equal to or greater than a width of the first hole of the metal bank layer.

* * * * *